United States Patent
Tokuda et al.

(10) Patent No.: US 10,811,040 B2
(45) Date of Patent: Oct. 20, 2020

(54) DISK DEVICE

(71) Applicants: KABUSHIKI KAISHA TOSHIBA, Minato-ku (JP); TOSHIBA ELECTRONIC DEVICES & STORAGE CORPORATION, Minato-ku (JP)

(72) Inventors: Kota Tokuda, Kawasaki (JP); Nobuhiro Yamamoto, Yokohama (JP)

(73) Assignees: KABUSHIKI KAISHA TOSHIBA, Minato-ku (JP); TOSHIBA ELECTRONIC DEVICES & STORAGE CORPORATION, Minato-ku (JP)

( * ) Notice: Subject to any disclaimer, the term of this patent is extended or adjusted under 35 U.S.C. 154(b) by 0 days.

(21) Appl. No.: 16/555,463

(22) Filed: Aug. 29, 2019

(65) Prior Publication Data

US 2020/0302960 A1    Sep. 24, 2020

(30) Foreign Application Priority Data

Mar. 19, 2019    (JP) .................................. 2019-051541

(51) Int. Cl.
*G11B 5/48* (2006.01)
*G11B 25/04* (2006.01)
(Continued)

(52) U.S. Cl.
CPC .......... *G11B 5/4846* (2013.01); *G11B 5/4886* (2013.01); *G11B 25/04* (2013.01);
(Continued)

(58) Field of Classification Search
CPC ....... G11B 5/4813; G11B 5/54; G11B 25/043; G11B 5/012; G11B 2007/0013
See application file for complete search history.

(56) References Cited

U.S. PATENT DOCUMENTS

| | | | | |
|---|---|---|---|---|
| 5,296,984 A | * | 3/1994 | Fick ..................... | G11B 5/4813 360/244.5 |
| 5,357,386 A | * | 10/1994 | Haidari ................ | G11B 5/4846 360/99.18 |

(Continued)

FOREIGN PATENT DOCUMENTS

| | | |
|---|---|---|
| JP | 9-9601 A | 1/1997 |
| JP | 2001-43640 A | 2/2001 |

(Continued)

*Primary Examiner* — Brian E Miller
(74) *Attorney, Agent, or Firm* — Oblon, McClelland, Maier & Neustadt, L.L.P.

(57) ABSTRACT

According to one embodiment, a disk device includes a plurality of disk-shaped recording media, a first actuator assembly supported by a support shaft, a second actuator assembly supported by the support shaft and spaced from the first actuator assembly, a flexible printed wiring board includes a base portion, a first relay portion extending from the base portion and connected to the first actuator assembly, and a second relay portion extending from the base portion and connected to the second actuator assembly, a support member fixed to the base portion of the flexible printed wiring board, and a reinforcing member provided in the base portion in the vicinity of the first relay portion and the second relay portion.

9 Claims, 10 Drawing Sheets

(51) Int. Cl.
  *H05K 1/02* (2006.01)
  *H05K 1/14* (2006.01)
  *H05K 1/03* (2006.01)
(52) U.S. Cl.
  CPC ......... *H05K 1/0281* (2013.01); *H05K 1/0393* (2013.01); *H05K 1/147* (2013.01); *H05K 2201/09063* (2013.01); *H05K 2201/10189* (2013.01)

(56) References Cited

U.S. PATENT DOCUMENTS

| | | | | |
|---|---|---|---|---|
| 5,644,448 A * | 7/1997 | Suzuki | G11B | 5/486 |
| | | | | 360/264.2 |
| 5,717,541 A * | 2/1998 | Ycas | G11B | 21/02 |
| | | | | 360/264.2 |
| 5,835,308 A | 11/1998 | Hasegawa | | |
| 5,909,342 A * | 6/1999 | Forbord | G11B | 5/59605 |
| | | | | 360/264.2 |
| 5,923,501 A * | 7/1999 | Suzuki | G11B | 5/4806 |
| | | | | 360/264.2 |
| 5,991,123 A * | 11/1999 | Casey | G11B | 5/4833 |
| | | | | 360/264.2 |
| 6,018,439 A * | 1/2000 | Forbord | G11B | 5/4833 |
| | | | | 360/264.2 |
| 6,108,174 A * | 8/2000 | Adams | G11B | 5/6005 |
| | | | | 360/266.1 |
| 6,115,215 A * | 9/2000 | Adams | G11B | 5/553 |
| | | | | 360/264.4 |
| 6,236,531 B1 * | 5/2001 | Allsup | G11B | 5/4846 |
| | | | | 360/264.2 |
| 6,429,999 B1 * | 8/2002 | Dague | G11B | 5/4806 |
| | | | | 360/264.3 |
| 6,560,075 B2 * | 5/2003 | Price | G11B | 5/4813 |
| | | | | 360/246.7 |
| 6,603,640 B1 * | 8/2003 | Prater | F16C | 19/54 |
| | | | | 360/264.4 |
| 6,678,112 B1 * | 1/2004 | Kaneko | G11B | 5/4846 |
| | | | | 360/99.18 |
| 6,690,549 B1 * | 2/2004 | Aikawa | G11B | 5/4813 |
| | | | | 360/264.4 |
| 6,934,126 B1 * | 8/2005 | Berding | G11B | 5/4846 |
| | | | | 360/264.2 |
| 7,649,717 B2 * | 1/2010 | Hayakawa | G11B | 5/5526 |
| | | | | 360/264.2 |
| 7,649,718 B1 * | 1/2010 | Edwards | G11B | 5/4846 |
| | | | | 360/264.2 |
| 7,957,101 B2 * | 6/2011 | Matsui | G11B | 5/486 |
| | | | | 29/603.03 |
| 8,068,314 B1 * | 11/2011 | Pan | G11B | 5/5569 |
| | | | | 360/245.9 |
| 8,213,125 B2 * | 7/2012 | McCaslin | G11B | 25/043 |
| | | | | 360/264 |
| 8,270,120 B2 * | 9/2012 | Kerner | G11B | 5/4846 |
| | | | | 360/245.9 |
| 8,804,348 B2 | 8/2014 | Tanaka et al. | | |
| 9,001,470 B1 * | 4/2015 | Chan | G11B | 5/4846 |
| | | | | 360/264.2 |
| 9,286,924 B1 * | 3/2016 | Akatsuka | G11B | 5/4846 |
| 9,899,048 B1 * | 2/2018 | Vijay | H05K | 1/0278 |
| 10,115,421 B2 * | 10/2018 | Vijay | H05K | 1/0278 |
| 10,304,483 B1 * | 5/2019 | Unger | G11B | 5/4826 |
| 2002/0039260 A1 * | 4/2002 | Kilmer | G11B | 5/5521 |
| | | | | 360/264.7 |
| 2002/0060885 A1 * | 5/2002 | Money | G11B | 5/5521 |
| | | | | 360/264.4 |
| 2005/0068682 A1 * | 3/2005 | Sasaki | G11B | 5/4846 |
| | | | | 360/264.7 |
| 2005/0141141 A1 * | 6/2005 | Sekimoto | G11B | 5/4846 |
| | | | | 360/266.3 |
| 2005/0152071 A1 * | 7/2005 | Hayakawa | G11B | 5/5526 |
| | | | | 360/266.3 |
| 2006/0012921 A1 * | 1/2006 | Kubota | G11B | 5/4833 |
| | | | | 360/264.2 |
| 2006/0276058 A1 * | 12/2006 | Freeman | G11B | 5/4846 |
| | | | | 439/67 |
| 2006/0291094 A1 * | 12/2006 | Ueda | G11B | 25/043 |
| | | | | 360/97.19 |
| 2007/0097552 A1 * | 5/2007 | Lee | G11B | 5/4846 |
| | | | | 360/245.9 |
| 2007/0146935 A1 * | 6/2007 | Minami | G11B | 5/4833 |
| | | | | 360/245.9 |
| 2009/0244782 A1 * | 10/2009 | Kagawa | G11B | 5/4846 |
| | | | | 360/245.8 |
| 2010/0067150 A1 * | 3/2010 | Kavosh | G11B | 5/4806 |
| | | | | 360/264.2 |
| 2011/0216445 A1 * | 9/2011 | Awaga | G11B | 5/54 |
| | | | | 360/264.2 |
| 2019/0076958 A1 | 3/2019 | Izumi | | |

FOREIGN PATENT DOCUMENTS

| | | |
|---|---|---|
| JP | 2004-39674 A | 2/2004 |
| JP | 2012-84798 A | 4/2012 |
| JP | 2019-51541 A | 4/2019 |

* cited by examiner

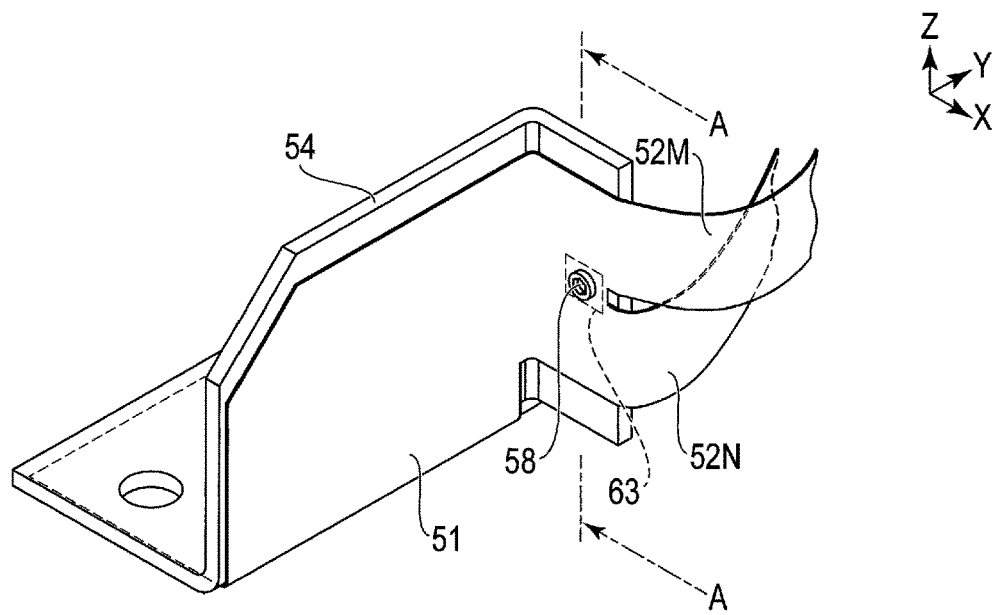
F I G. 5
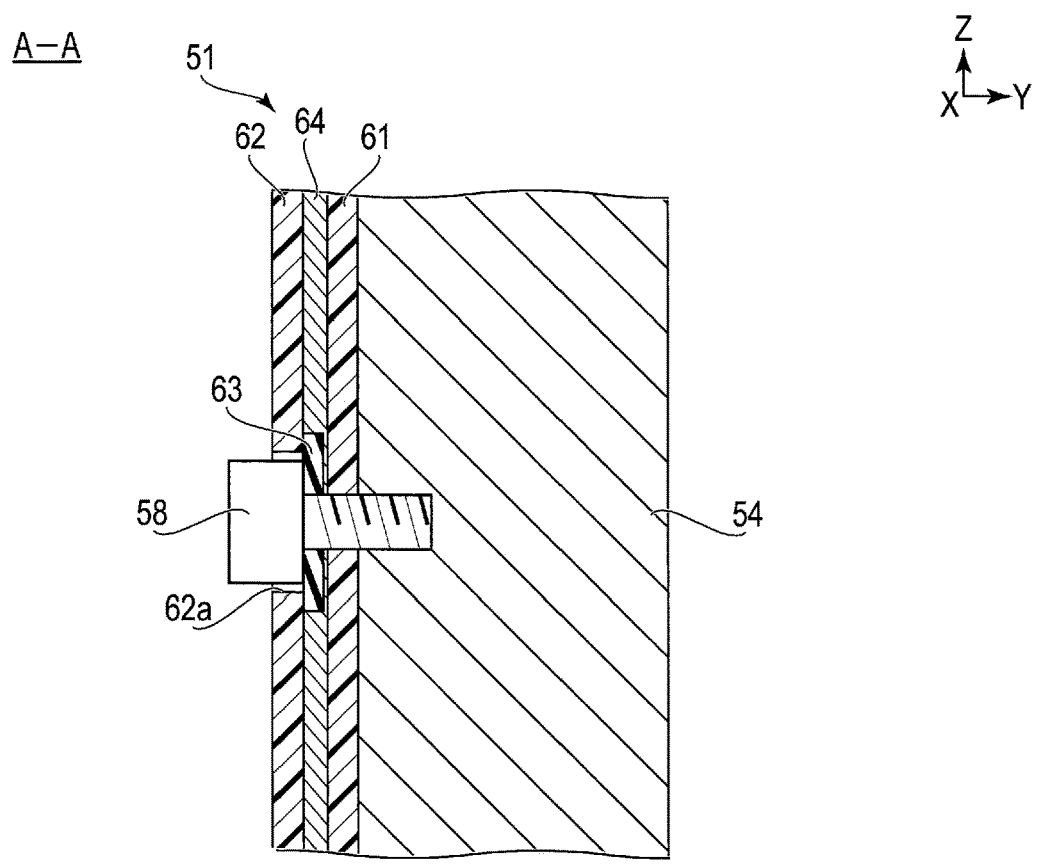
F I G. 6

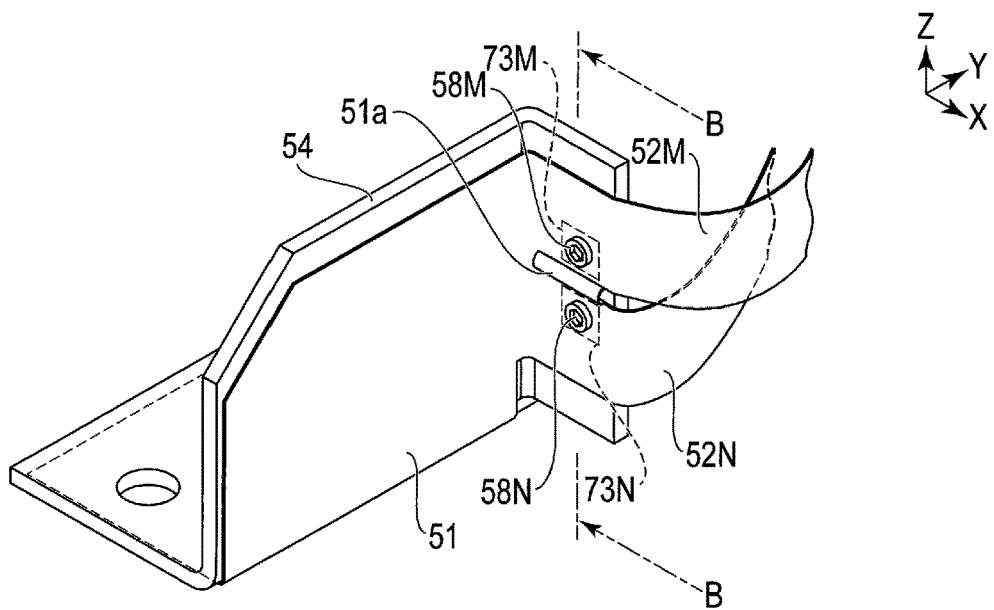
F I G. 7
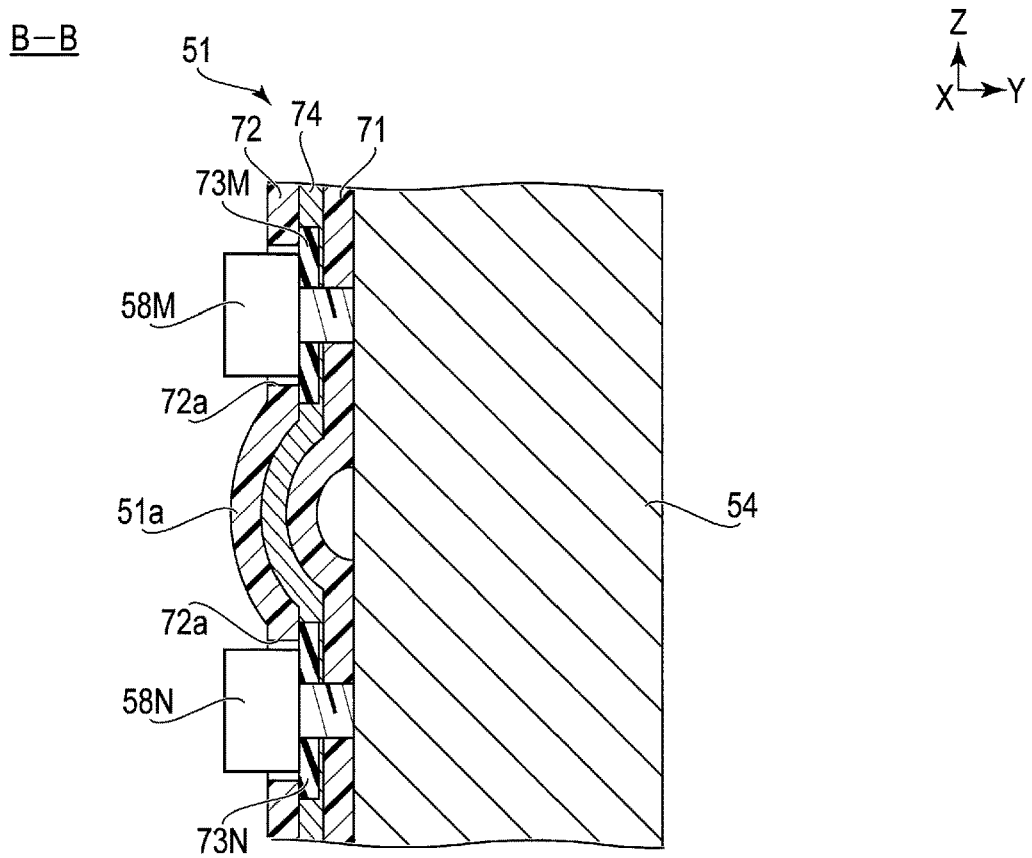
F I G. 8

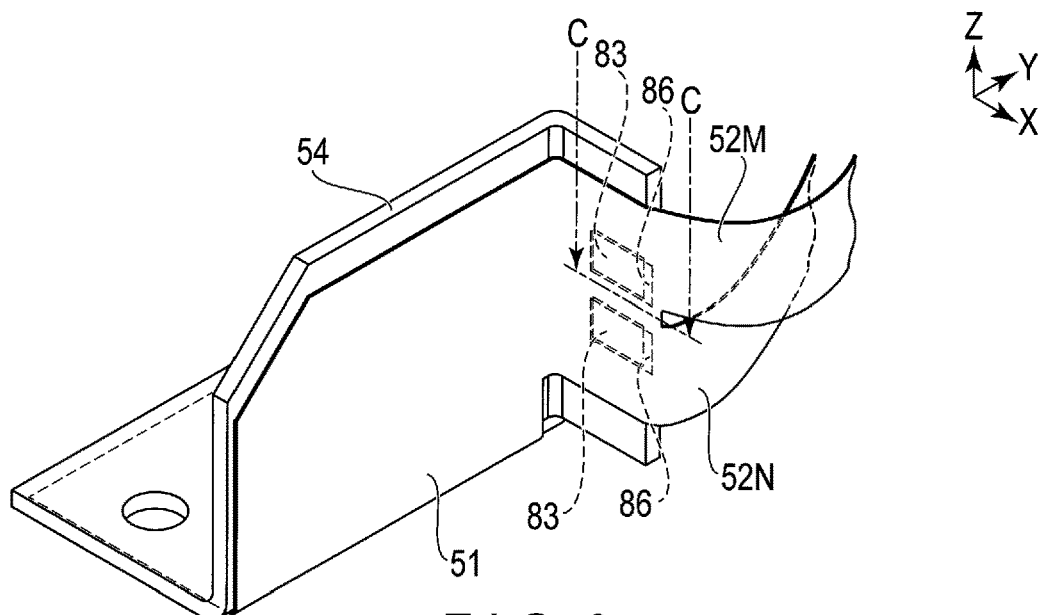
F I G. 9
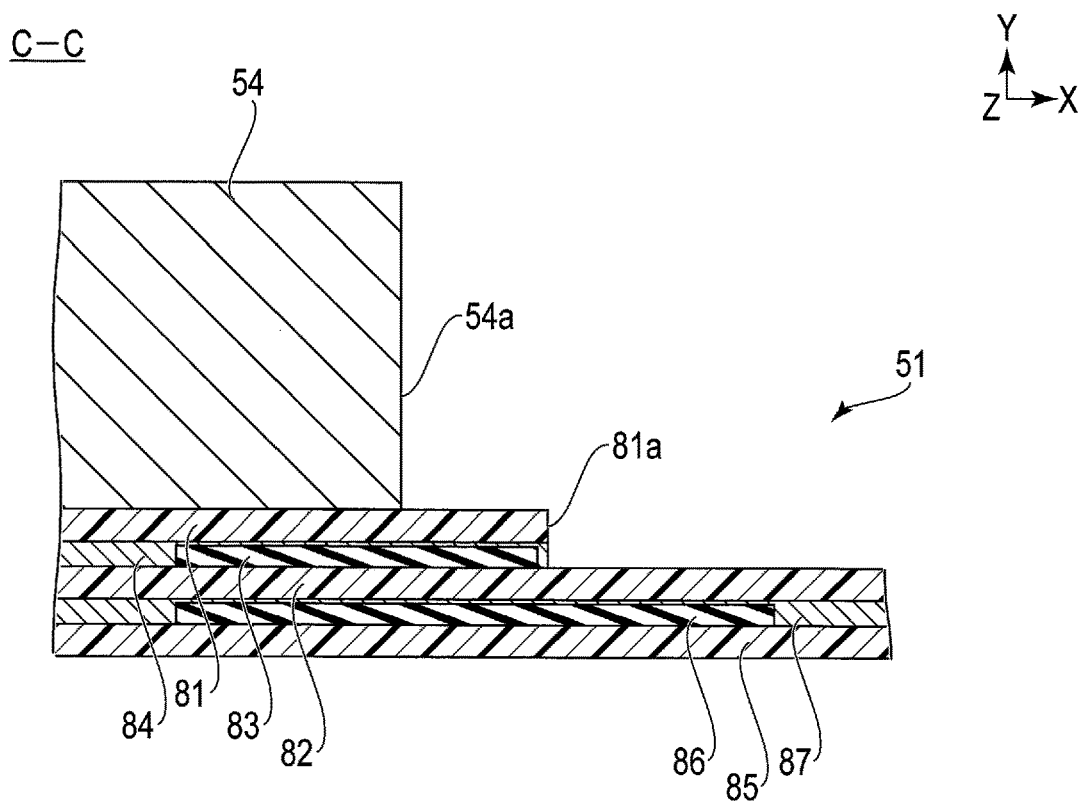
F I G. 10

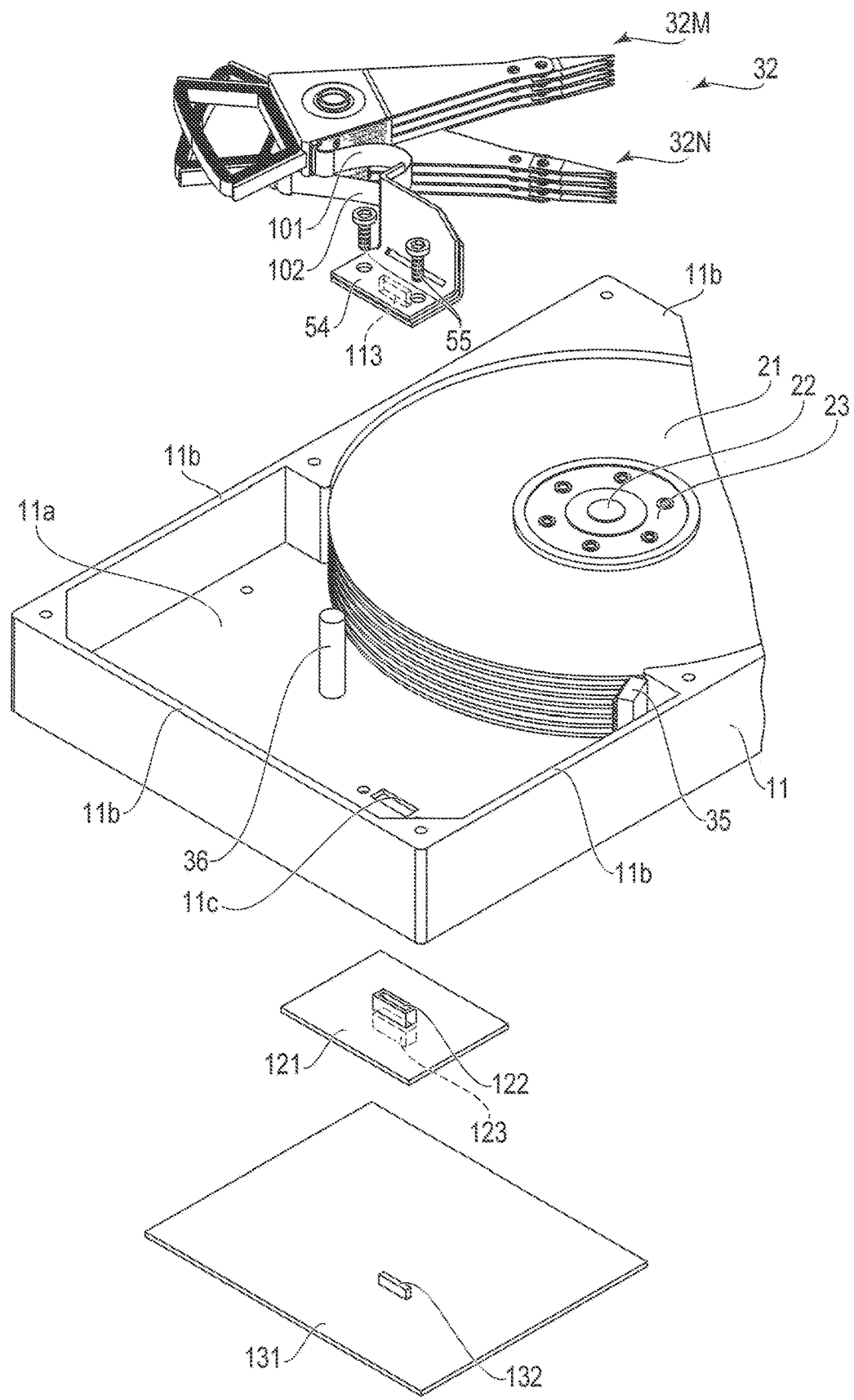
F I G. 11

DISK DEVICE

CROSS-REFERENCE TO RELATED APPLICATIONS

This application is based upon and claims the benefit of priority from Japanese Patent Application No. 2019-051541, filed Mar. 19, 2019, the entire contents of which are incorporated herein by reference.

FIELD

Embodiments described herein relate generally to a disk device.

BACKGROUND

In recent years, as the storage capacity of a hard disk drive (HDD) increases, the number of magnetic disks installed also increases. In order to cope with a large number of magnetic disks, a so-called split actuator in which a plurality of head actuator assemblies, for example, two head actuator assemblies are stacked is proposed.

Here, when the plurality of head actuator assemblies are coaxially rotated, there is a risk that an excessive load may be applied to a flexible printed wiring board attached to each head actuator assembly.

BRIEF DESCRIPTION OF THE DRAWINGS

FIG. 5 is a perspective view illustrating a base portion, a first relay portion, and a second relay portion of the FPC unit.

FIG. 6 is a cross-sectional view of the base portion, taken along line A-A of FIG. 5.

FIG. 7 is a perspective view illustrating a base portion, a first relay portion, and a second relay portion of the FPC unit according to modification 1 of the first embodiment.

FIG. 8 is a cross-sectional view of the base portion, taken along line B-B of FIG. 7.

FIG. 9 is a perspective view illustrating a base portion, a first relay portion, and a second relay portion of the FPC unit according to modification 2 of the first embodiment.

FIG. 10 is a cross-sectional view of the base portion and one relay portion, taken along line C-C of FIG. 9.

FIG. 11 is an exploded perspective view of a hard disk drive (HDD) including a disk device according to a second embodiment.

DETAILED DESCRIPTION

Figure 1:
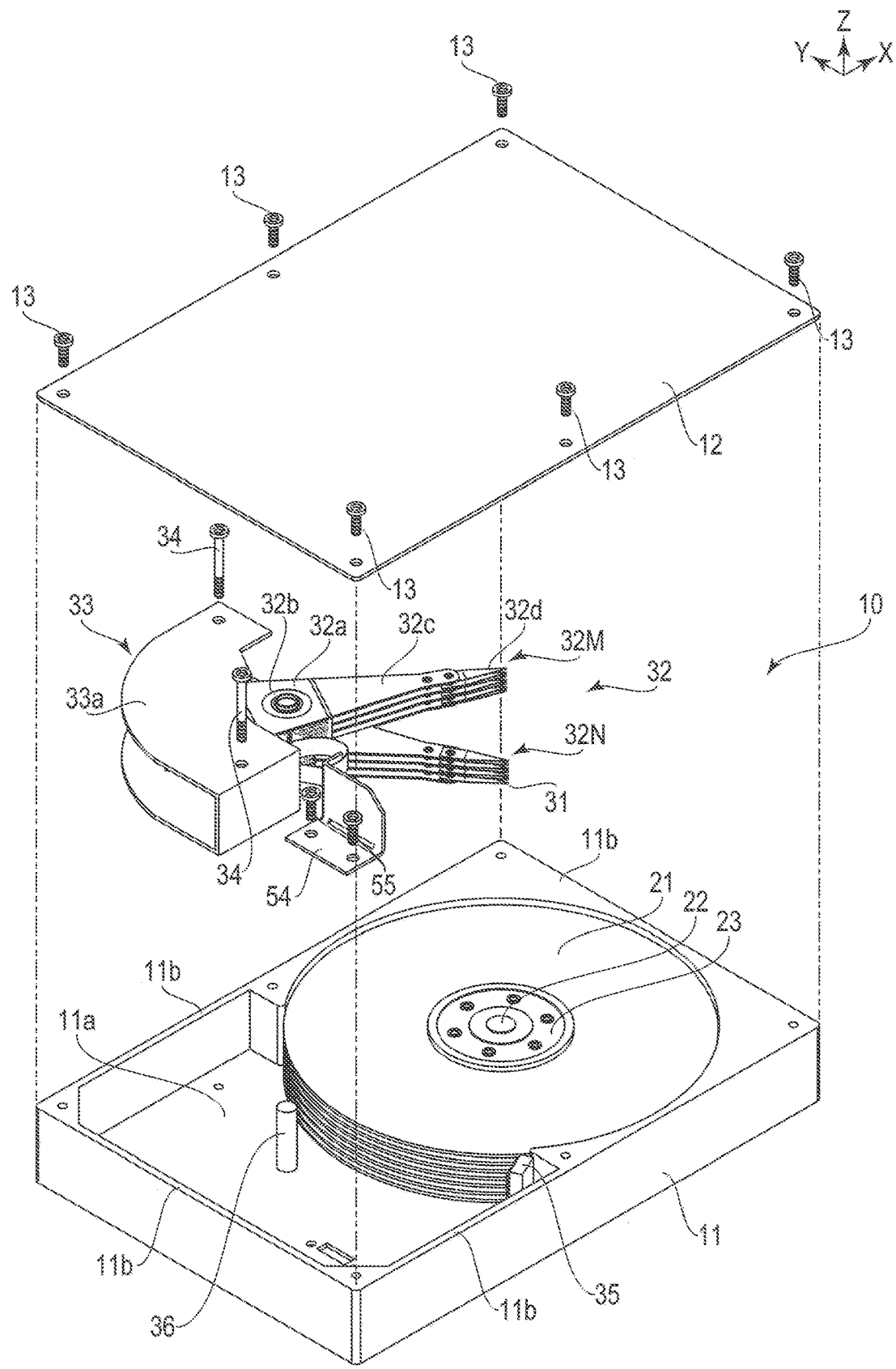
FIG. 1 is an exploded perspective view of a hard disk drive (HDD) including a disk device according to a first embodiment.

An object of the embodiment of the present invention is to provide a disk device capable of improving the rigidity of a flexible printed wiring board.

In general, according to one embodiment, a disk device comprises: a plurality of disk-shaped recording media; a first actuator assembly supported by a support shaft; a second actuator assembly supported by the support shaft and spaced from the first actuator assembly; a flexible printed wiring board comprising a base portion, a first relay portion extending from the base portion and connected to the first actuator assembly, and a second relay portion extending from the base portion and connected to the second actuator assembly; a support member fixed to the base portion of the flexible printed wiring board; and a reinforcing member provided in the base portion in the vicinity of the first relay portion and the second relay portion.

A disk device according to an embodiment will be described below with reference to the drawings.

The disclosure is merely an example, and appropriate modifications which can be easily conceived by those skilled in the art without departing from the spirit of the invention are naturally included in the scope of the present invention. Although the drawings may be schematically represented with respect to the width, thickness, shape, and the like of each portion in comparison with an actual embodiment so as to make the description clearer, this is merely an example and it is not intended to limit the interpretation of the present invention. In the specification and the drawings, components similar to those described above with respect to the preceding drawings may be denoted by the same reference numerals, and detailed description thereof will be appropriately omitted.

First Embodiment

As a disk device, a hard disk drive (HDD) according to a first embodiment will be described in detail.

FIG. 1 is an exploded perspective view of an HDD according to a first embodiment.

The HDD includes a housing 10 having a flat and substantially rectangular shape. The housing 10 includes a base 11 having a rectangular box with an opened upper surface, and a top cover 12. The base 11 includes a rectangular bottom wall 11a spaced apart from the top cover 12, and a plurality of side walls 11b provided upright along the periphery of the bottom wall 11a and is integrally formed of, for example, aluminum. The top cover 12 is formed of, for example, stainless steel in a rectangular plate shape. The top cover 12 is screwed to the side walls 11b of the base 11 by a plurality of screws 13 and closes the upper opening of the base 11.

A plurality of magnetic disks 21 as a recording medium and a spindle motor 22 as a driving unit which supports and rotates the magnetic disks 21 are provided in the housing 10. The spindle motor 22 is disposed on the bottom wall 11a. Each of the magnetic disks 21 includes, for example, a 3.5-inch magnetic recording layer on an upper surface and/or a lower surface. Each of the magnetic disks 21 is coaxially fitted to a hub (not illustrated) of the spindle motor 22 and clamped by a clamp spring 23, and is fixed to the hub. Each of the magnetic disks 21 is supported in a state of being positioned parallel to the bottom wall 11a of the base 11. The plurality of magnetic disks 21 are rotated by the spindle motor 22 at a predetermined rotational speed. In the present embodiment, for example, seven magnetic disks 21 are accommodated in the housing 10, but the number of magnetic disks 21 is not limited thereto.

A plurality of magnetic heads 31 which record and read information on and from the magnetic disks 21, and a plurality of actuator assemblies (hereinafter also referred to as split actuators) 32 which movably support these magnetic heads 31 with respect to the magnetic disks 21 are provided in the housing 10. The split actuator 32 includes a plurality of actuator assemblies, for example, a first actuator assembly 32M and a second actuator assembly 32N. The first and second actuator assemblies 32M and 32N are supported by a common support shaft (pivot) 36. The second actuator assembly 32N is supported by a support shaft 36 and spaced apart from the first actuator assembly 32M.

Each of the first and second actuator assemblies 32M, 32N includes an actuator block 32a supported by the support shaft 36 via a bearing unit 32b, a plurality of arms 32c extending from the actuator block 32a, and a suspension assembly 32d extending from each arm 32c. The magnetic head 31 is supported at the tip of each suspension assembly 32d. The support shaft 36 is provided upright on the bottom wall 11a.

A pair of voice coil motors (hereinafter referred to as VCMs) 33 which rotates and positions the first and second actuator assemblies 32M and 32N and a plurality of screws 34 which screw the VCMs 33 to the bottom wall 11a of the base 11 are provided in the housing 10. Furthermore, a ramp loading mechanism 35 which holds the magnetic head 31 at an unloading position separated from the magnetic disk 21 when the magnetic head 31 moves to the outermost periphery of the magnetic disk 21 is provided in the housing 10.

A printed circuit board (not illustrated) is screwed to the outer surface of the bottom wall 11a of the base 11. The printed circuit board constitutes a control unit, and the control unit controls the operation of the spindle motor 22 and also controls the operations of the VCMs 33 and the magnetic heads 31 via the FPC unit 50.

Figure 2:
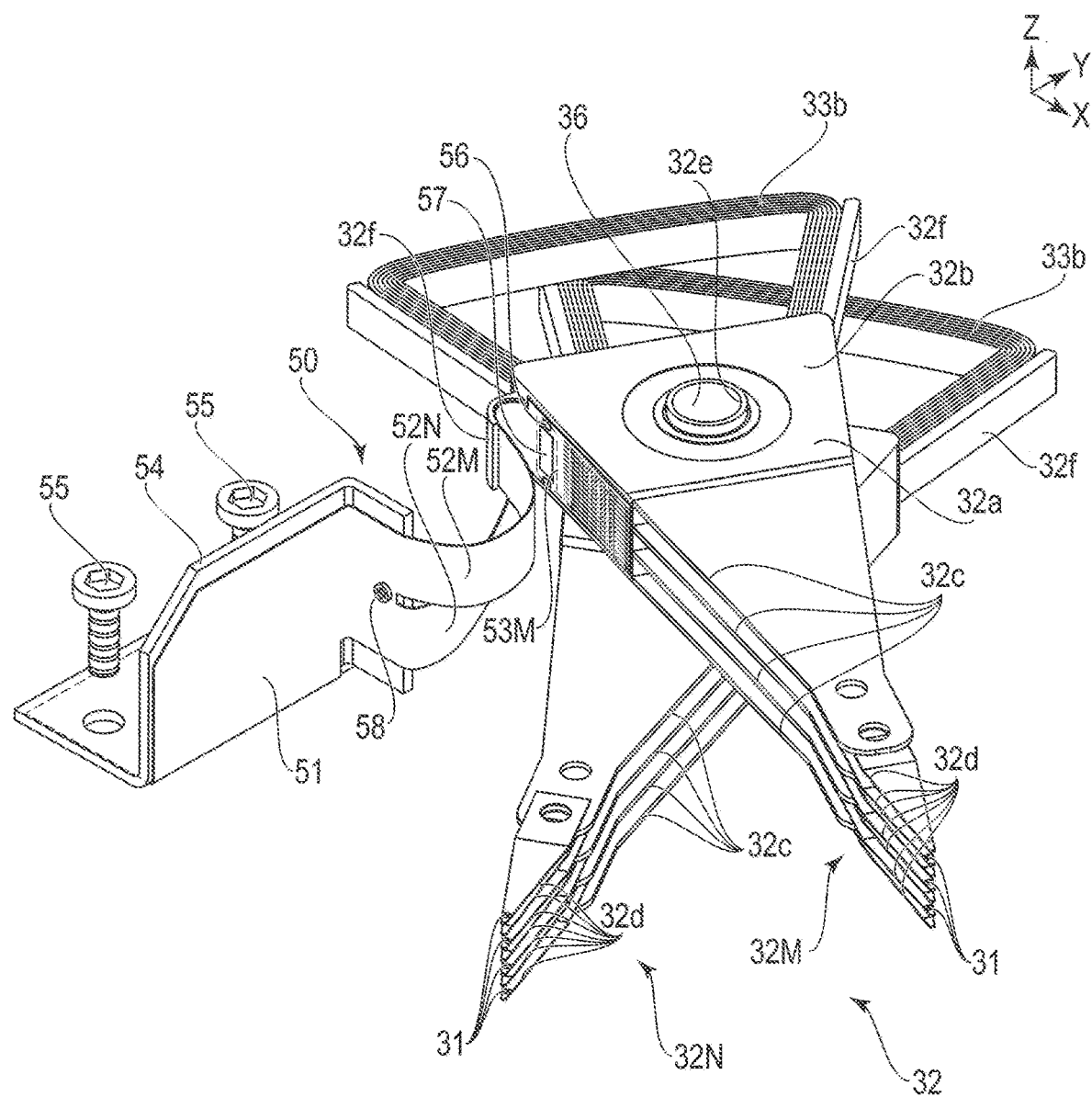
FIG. 2 is a perspective view illustrating a split actuator and an FPC unit.
Figure 3:
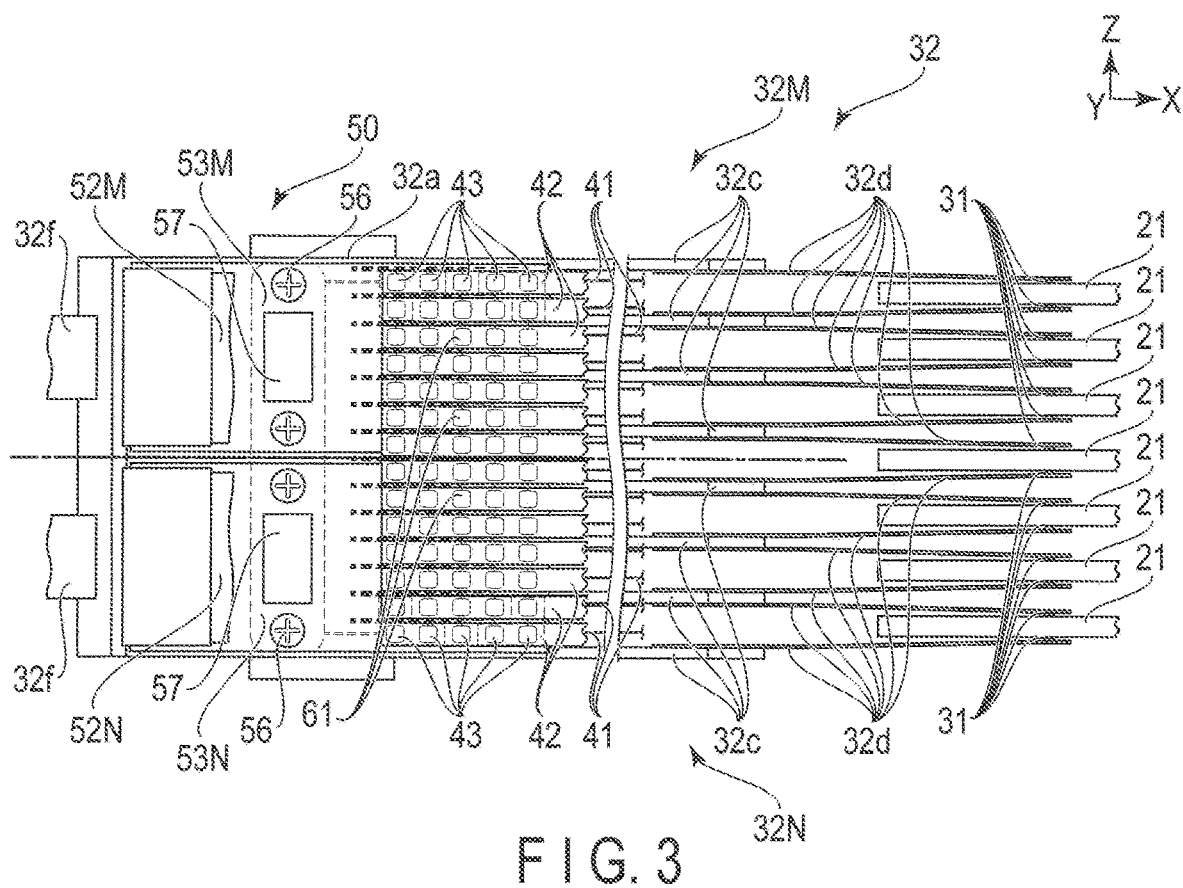
FIG. 3 is a side view of the split actuator.

FIG. 2 is a perspective view illustrating the split actuator 32 and the FPC unit 50. FIG. 3 is a side view of the split actuator.

The first and second actuator assemblies 32M and 32N have similar configurations. Therefore, the configuration of the first actuator assembly 32M will be described, and the description of the configuration of the second actuator assembly 32N will be omitted.

The first actuator assembly 32M includes an actuator block 32a having a through hole 32e, a bearing unit (unit bearing) 32b provided in the through hole 32e, a plurality of arms 32c, for example, four arms 32c extending from the actuator block 32a, and seven suspension assemblies 32d attached to each arm 32c. The bearing unit 32b supports the actuator block 32a to the support shaft (pivot) 36 provided upright on the bottom wall 11a.

In the present embodiment, the actuator block 32a and the four arms 32c are integrally formed of aluminum or the like to constitute a so-called E block. The arm 32c is formed in, for example, an elongated flat plate shape and extends from the actuator block 32a in a direction orthogonal to the support shaft 36. The four arms 32c are spaced apart from each other and provided in parallel.

The first actuator assembly 32M includes a support frame 32f extending from the actuator block 32a in a direction opposite to the arm 32c. A voice coil 33b constituting a part of the VCM 33 is supported by the support frame 32f. As illustrated in FIG. 1, the voice coil 33b is positioned between a pair of yokes 33a, one of which is fixed on the base 11, and constitutes the VCM 33 together with the yokes 33a and magnets fixed to the yokes 33a.

The first actuator assembly 32M includes seven suspension assemblies 32d which support the magnetic heads 31, respectively. The suspension assemblies 32d are attached to the tips of the respective arms 32c. The seven suspension assemblies 32d include three up head suspension assemblies which support the magnetic heads 31 upward, and four down head suspension assemblies which support the magnetic heads 31 downward. The up head suspension assemblies and the down head suspension assemblies are configured by arranging the suspension assemblies 32d having the same structure in the up and down direction.

The down head suspension assemblies 32d and the up head suspension assemblies 32d of each set are positioned in parallel with each other at a predetermined interval, and the magnetic heads 31 are positioned to face each other. These magnetic heads 31 are positioned to face both sides of the corresponding magnetic disk 21.

In the present embodiment, in FIGS. 2 and 3, the down head suspension assembly 32d is attached to the uppermost arm 32c, and the up head suspension assembly 32d and the down head suspension assembly 32d are attached to the other arms 32c.

In the second actuator assembly 32N, the seven suspension assemblies 32d include four up head suspension assemblies which support the magnetic heads 31 upward and three down-head suspension assemblies which support the magnetic heads 31 downward. In addition, in the second actuator assembly 32N, the up head suspension assembly 32d is attached to the lowermost arm 32c, and the up head suspension assembly 32d and the down head suspension assembly 32d are attached to the other arms 32c.

Figure 4:
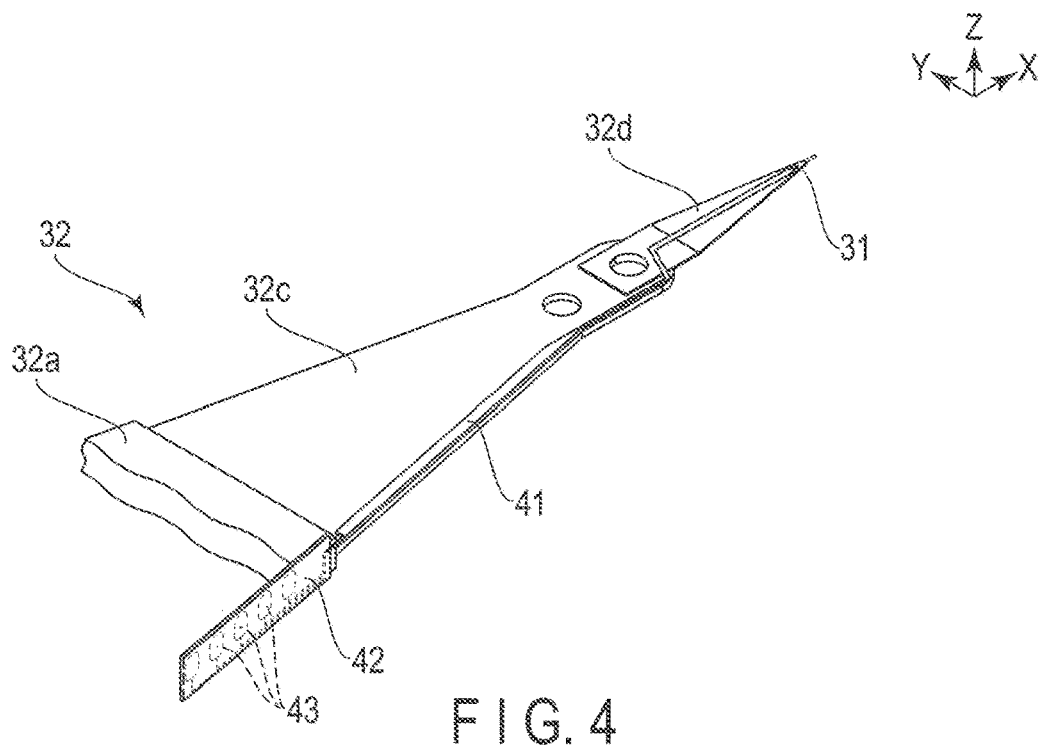
FIG. 4 is a perspective view of a suspension assembly.

FIG. 4 is a perspective view illustrating the suspension assembly 32d.

The suspension assembly 32d includes a flexure (wiring member) 41 having an elongated band shape. The flexure 41 includes a metal plate (backing layer) such as stainless steel as a base, an insulating layer formed on the metal plate, a conductive layer constituting a plurality of wirings (wiring patterns) formed on the insulating layer, and a cover layer (protective layer, insulating layer) covering the conductive layer. The flexure 41 is in the form of a laminate having an elongated band shape. The wiring of the flexure 41 is electrically connected to a read element, a write element, a heater, and other members of the magnetic head 31.

A connection end portion (tail connection terminal portion) 42 is provided in the flexure 41. The connection end portion 42 is formed in an elongated rectangular shape extending in a horizontal direction. For example, seven connection end portions 42 are provided along a vertical direction.

A plurality of connection terminals (connection pads) 43 are provided in the connection end portion 42. The connection terminals 43 are respectively connected to the wirings of the flexure 41. That is, the plurality of wirings of the flexure 41 extend over substantially the entire length of the flexure 41. One end of the wiring is electrically connected to the magnetic head 31, and the other end of the wiring is connected to the connection terminal (connection pad) 43 of the connection end portion 42. A solder is formed on the connection terminal 43. The connection end portion 42 (connection member), in which the connection terminal 43 is provided, is electrically connected to the connection pad.

As illustrated in FIGS. 2 and 3, the FPC unit 50 includes a base portion 51 having a substantially rectangular shape, a first relay portion 52M having an elongated band shape extending from one side edge of the base portion 51, and a first bonding portion 53M having a substantially rectangular shape and provided continuously to the tip of the first relay portion 52M. Similarly, the FPC unit 50 includes a base portion 51 having a substantially rectangular shape, a second relay portion 52N having an elongated band shape extending from one side edge of the base portion 51, and a second bonding portion 53N having a substantially rectangular shape and provided continuously to the tip of the second relay portion 52N. The base portion 51, the first relay portion 52M, the second relay portion 52N, the first bonding portion 53M, and the second bonding portion 53N are formed by a flexible printed wiring board (FPC). The flexible printed wiring board (FPC) is configured as a multilayer circuit board having two conductive layers.

Electronic components such as a conversion connector (not illustrated) and a plurality of capacitors are mounted on one surface (outer surface) of the base portion 51 and electrically connected to wirings (not illustrated). A support member 54 is attached to the other surface (inner surface) of the base portion 51. The support member 54 supports the base portion 51 of the FPC unit 50. The base portion 51 is bent along a plurality of support members 54 which are bent in different directions. The base portion 51 is disposed on the bottom wall 11a of the housing 10 and is screwed to the bottom wall 11a by a plurality of screws 55 via the support member 54. The conversion connector on the base portion 51 is connected to a control circuit board provided on the bottom surface side of the housing 10.

The first relay portion 52M extends from the base portion 51 toward the first actuator assembly 32M. The first bonding portion 53M provided at the extension end of the first relay portion 52M is formed in a rectangular shape having substantially the same height and width as those of the side surface (installation surface) of the actuator block 32a. The first bonding portion 53M is attached to the installation surface of the actuator block 32a of the first actuator assembly 32M via a backing plate formed of aluminum or the like and is further screwed and fixed to the installation surface by a fixing screw 56.

The first bonding portion 53M and the second bonding portion 53N have similar configurations. Therefore, the configuration of the first bonding portion 53M will be described, and the description of the configuration of the second bonding portion 53N will be omitted.

The wiring of the first bonding portion 53M is electrically connected to the connection end portions 42 of seven flexures 41 provided at the upper and lower sides of the first actuator assembly 32M and the connection end portions 42 of seven flexures 41 provided on the upper and lower sides of the second actuator assembly 32N. A head IC 57 (semiconductor element) is mounted on the first bonding portion 53M. The head IC 57 is connected to the connection end portion 42 and the base portion 51 via the wiring of the FPC connected to the first actuator assembly 32M. Furthermore, the first bonding portion 53M includes a pair of connection pads, and the voice coil 33b is connected to these connection pads.

The seven magnetic heads 31 of the actuator assembly 32M are electrically connected to the base portions 51 via the wirings of the flexure 41, the connection end portions 42, the first bonding portions 53M of the FPC unit 50, and the first relay portions 52M, respectively. Similarly, the seven magnetic heads 31 of the second actuator assembly 32N are electrically connected to the base portions 51 via the wirings of the flexure 41, the connection end portions 42, the second bonding portions 53N of the FPC unit 50, and the second relay portions 52N, respectively. Furthermore, the base portion 51 is electrically connected to the printed circuit board on the bottom surface side of the housing 10 via the conversion connector.

A reinforcing structure between the base portion 51 and the first relay portion 52M and between the base portion 51 and the second relay portion 52N in the FPC unit 50 will be described.

FIG. 5 is a perspective view illustrating the base portion, the first relay portion, and the second relay portion of the FPC unit. FIG. 6 is a cross-sectional view of the base portion, taken along line A-A of FIG. 5.

As illustrated in FIGS. 5 and 6, the base portion 51 of the portion adjacent to the first relay portion 52M and the second relay portion 52N is configured by being attached by an adhesive layer 64 in a state in which a metal layer 63 (reinforcing member) formed of a copper plate or the like is sandwiched between, for example, the first insulating layer 61 formed of polyimide or the like and, for example, the second insulating layer 62 formed of polyimide or the like. The first insulating layer 61 is in contact with the support member 54. The second insulating layer 62 includes a screw hole 62a formed in a portion adjacent to the metal layer 63. The metal layer 63 is provided in the base portion 51 so as to be disposed between the first relay portion 52M and the second relay portion 52N.

The base portion 51 is screwed to the support member 54 via the metal layer 63 and the first insulating layer 61 by the fixing screw 58 (reinforcing member) inserted through the screw hole 62a of the second insulating layer 62 in a portion adjacent to the first relay portion 52M and the second relay portion 52N.

According to the disk device of the first embodiment, which is configured as described above, the FPC unit 50 includes a base portion 51, a first relay portion 52M extending from the base portion 51 and connected to the first actuator assembly 32M, and a second relay portion 52N extending from the base portion 51 and connected to the second actuator assembly 32N. The support member 54 is fixed to the base portion 51 of the FPC unit 50. The reinforcing member (fixing screw 58, metal layer 63) is provided in the base portion 51 in the vicinity of the first relay portion 52M and the second relay portion 52N. In particular, the metal layer 63 is provided in the base portion 51 in the vicinity of the first relay portion 52M and the second relay portion 52N so as to reinforce the FPC unit 50. Therefore, it is possible to improve the rigidity of the connection portion between the first relay portion 52M and the base portion 51 and the connection portion between the second relay portion 52N and the base portion 51, to which a load is applied according to the operations of the first and second actuator assemblies 32M and 32N which independently rotate. In particular, when the first and second actuator assemblies 32M and 32N rotate in different directions, it is possible to improve the rigidity of the connection portion between the second relay portion 52N and the base portion 51 and the connection portion between the first relay portion 52M and the base portion 51, to which a relatively large load is applied.

From the above, it is possible to obtain the disk device capable of improving the rigidity of the FPC unit 50 (including the flexible printed wiring board).

In addition, according to the disk device of the first embodiment, the metal layer 63 is provided in an intermediate region between the first relay portion 52M and the second relay portion 52N in the base portion 51. Therefore, as the first and second actuator assemblies 32M and 32N rotate, it is possible to improve the rigidity in the middle between the vicinity of the first relay portion 52M and the vicinity of the second relay portion 52N, to which a relatively large stress acts.

In addition, according to the disk device of the first embodiment, the reinforcing member includes the metal layer 63 provided in the base portion 51, and the fixing screw 58 which fastens the metal layer 63 and the base portion 51 to the support member 54. Therefore, the stress generated in the base portion 51 adjacent to the first relay portion 52M as the first actuator assembly 32M rotates and the stress generated in the base portion 51 adjacent to the second relay portion 52N as the second actuator assembly 32N rotates can be prevented from being separated and transmitted to each other by a simple configuration.

In addition, according to the disk device of the first embodiment, the FPC unit 50 includes a ground pad 63, and the metal layer 63 is integrally formed with the ground pad 63. Therefore, the metal layer 63 can be inexpensively configured by the same conductive layer as the ground pad 63. That is, it is not necessary to provide a new layer so as to form the metal layer 63.

Next, a disk device according to another embodiment will be described. In another embodiment described below, the same reference numerals as in the first embodiment described above are assigned to the same parts as in the first embodiment, the detailed description thereof will be omitted or simplified, and the description will focus on parts different from those of the first embodiment.

(Modification 1 of First Embodiment)

FIG. 7 is a perspective view illustrating a base portion, a first relay portion, and a second relay portion of the FPC unit according to modification 1 of the first embodiment. FIG. 8 is a cross-sectional view of the base portion, taken along line B-B of FIG. 7.

As illustrated in FIGS. 7 and 8, the base portion 51 of the portion adjacent to the first relay portion 52M and the second relay portion 52N are configured by being attached by an adhesive layer 74 in a state in which a first metal layer 73M (reinforcing member) and a second metal layer 73N (reinforcing member) formed of a copper plate or the like is separated and sandwiched between, for example, the first insulating layer 71 formed of polyimide or the like and, for example, the second insulating layer 72 formed of polyimide or the like. The first insulating layer 71 is in contact with the support member 54. In the second insulating layer 72, a pair of screw holes 72a is formed in a portion adjacent to the first metal layer 73M and the second metal layer 73N which are provided separately. The first metal layer 73M and the second metal layer 73N are provided in the base portion 51 so as to be adjacent to the first relay portion 52M and the second relay portion 52N.

In the base portion 51, the first insulating layer 71 and the second insulating layer 72 are curved in a convex shape in the portion between the first metal layer 73M and the second metal layer 73N. The curved portion 51a of the first insulating layer 71, which is curved in the convex shape, is separated from the support member 54. That is, the base portion 51 is curved so as to separate the first relay portion 52M and the second relay portion 52N in the portion between the first relay portion 52M and the second relay portion 52N.

The base portion 51 is screwed to the support member 54 via the first metal layer 73M, the second metal layer 73N, and the first insulating layer 61 by the first fixing screw 58M (reinforcing member) and the second fixing screw 58N (reinforcing member) in the portion adjacent to the first relay portion 52M and the second relay portion 52N.

According to the disk device of modification 1 of the first embodiment, which is configured as described above, the reinforcing member includes the first metal layer 73M provided in the base portion 51 on the first relay portion 52M side, the second metal layer 73N provided in the base portion 51 on the second relay portion 52N side, the first fixing screw 58M which fastens the first metal layer 73M and the base portion 51 to the support member, and the second fixing screw 58N which fastens the second metal layer 73N and the base portion 51 to the support member 54. Therefore, the stress generated in the base portion 51 adjacent to the first relay portion 52M as the first actuator assembly 32M rotates and the stress generated in the base portion 51 adjacent to the second relay portion 52N as the second actuator assembly 32N rotates can be prevented from being separated and transmitted to each other by a simple configuration.

In addition, according to the disk device of modification 1 of the first embodiment, the base portion 51 includes a curved portion 51a formed between the first metal layer 73M and the second metal layer 73N and curved in a direction away from the support member 54. Therefore, the stress generated in the base portion 51 adjacent to the first relay portion 52M as the first actuator assembly 32M rotates and the stress generated in the base portion 51 adjacent to the second relay portion 52N as the second actuator assembly 32N rotates can be prevented from being separated and transmitted to each other by the curved portion 51a.

(Modification 2 of First Embodiment)

FIG. 9 is a perspective view illustrating a base portion, a first relay portion, and a second relay portion of the FPC unit according to modification 2 of the first embodiment. FIG. 10 is a cross-sectional view of the base portion and one relay portion, taken along line C-C of FIG. 9.

As illustrated in FIGS. 9 and 10, the base portion 51 of the portion adjacent to the first relay portion 52M and the second relay portion 52N is configured by being attached by an adhesive layer 84 in a state in which a pair of metal layers (reinforcing members) formed of a copper plate or the like are separated and sandwiched between, for example, the first insulating layer 81 formed of polyimide or the like and, for example, the second insulating layer 82 formed of polyimide or the like. The first insulating layer 81 is in contact with the support member 54. An end portion 81a of the first insulating layer 81 protrudes outward from an edge portion 54a of the support member 54.

A pair of third metal layers 83 (reinforcing members) is provided in the base portion 51 so as to be adjacent to the first relay portion 52M and the second relay portion 52N. End portions of the pair of third metal layers 83 extend to the portions of the first relay portion 52M and the second relay portion 52N. In addition, the pair of third metal layers 83 is provided to cross the edge portion 54a of the support member 54. That is, the pair of third metal layers 83 is respectively positioned in a portion overlapping the support member 54 and a portion protruding outward from the support member 54.

The pair of third metal layers 83 is connected to the ground pad. In other words, the pair of third metal layers 83 is formed by partially extending the ground pad 83 in the same layer as the ground pad 83.

Furthermore, the base portion 51 is configured by being attached by an adhesive layer 87 in a state in which, for example, a pair of fourth metal layers 86 (reinforcing members) formed of a copper plate or the like is separated and sandwiched between the second insulating layer 82 and the third insulating layer 85 formed of, for example, polyimide or the like. The second insulating layer 82 and the third insulating layer 85 are integrally formed with the first relay portion 52M and the second relay portion 52N.

The pair of fourth metal layers 86 is provided in the base portion 51 so as to be adjacent to the first relay portion 52M and the second relay portion 52N. End portions of the pair of fourth metal layers 86 extend to the portions of the first relay portion 52M and the second relay portion 52N. In addition, the pair of fourth metal layers 86 is provided to cross the edge portion 54a of the support member 54. That is, the pair of fourth metal layers 86 is respectively positioned in a portion overlapping the support member 54 and a portion protruding outward from the support member 54. Furthermore, the pair of fourth metal layers 86 indirectly overlaps the pair of third metal layers 83 via the second insulating layer 82, and extends in a direction away from the support member 54 more than the pair of third metal layers 83. The pair of fourth metal layers 86 and the pair of third metal layers 83 may be directly stacked.

The pair of fourth metal layers 86 is connected to the ground pad. In other words, the pair of fourth metal layers 86 is formed by partially extending the ground pad 86 in the same layer as the ground pad 86.

According to the disk device of modification 2 of the first embodiment, which is configured as described above, the pair of third metal layers 83 and the pair of fourth metal layers 86 are provided in the base portion 51 across the edge portion 54a of the support member 54. Therefore, as the first actuator assembly 32M and the second actuator assembly 32N rotate, it is possible to prevent the base portion 51 adjacent to the first relay portion 52M and the second relay portion 52N from being pressed against the edge portion 54a of the support member 54 and thus damaged.

In addition, according to the disk device of modification 2 of the first embodiment, the third metal layer 83 and the fourth metal layer 86 are overlapped in the thickness direction of the base portion 51. In addition to a state in which the third metal layer 83 and the fourth metal layer 86 are indirectly overlapped via the insulating layer or the like as in the present embodiment, the overlapping in the thickness direction of the base portion 51 includes a state in which the third metal layer 83 and the fourth metal layer 86 are directly overlapped. Therefore, the third metal layer 83 and the fourth metal layer 86 can be made relatively thin to provide sufficient flexibility, and the rigidity can be enhanced by overlapping the third metal layer 83 and the fourth metal layer 86.

Second Embodiment

Figure 12:
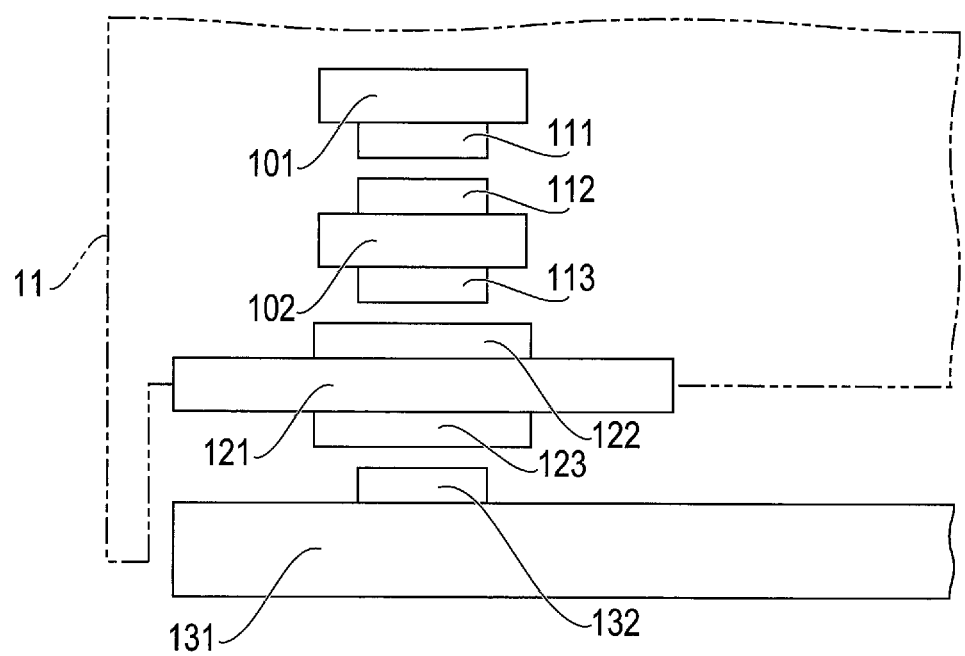
FIG. 12 is a schematic view illustrating a connection between an FPC unit and a control board of FIG. 11.

FIG. 11 is an exploded perspective view of a hard disk drive (HDD) according to a second embodiment. FIG. 12 is a schematic view illustrating a connection between an FPC unit and a control board of FIG. 11.

The HDD according to the second embodiment includes the following configuration.

The disk device includes a recording medium (magnetic disk 21), a first actuator assembly 32M, a second actuator assembly 32N, a first flexible printed wiring board (relay portion of a first FPC unit 101), a second flexible printed wiring board (relay portion of a second FPC unit 102), and a connector (first connector 111 and second connector 112).

The recording medium (magnetic disk 21) has a plurality of disk shapes and is rotatably provided. The first actuator assembly 32M is supported by the support shaft 36. The second actuator assembly 32N is supported by a support shaft 36 and spaced apart from the first actuator assembly 32M. The first flexible printed wiring board (the relay portion of the first FPC unit 101) is attached to the first actuator assembly 32M. The second flexible printed wiring board (the relay portion of the second FPC unit 102) is attached to the second actuator assembly 32N. The connectors (the first connector 111 and the second connector 112) are movable and electrically connect the first flexible printed wiring board (the relay portion of the first FPC unit 101) and the second flexible printed wiring board (the relay portion of the second FPC unit 102).

The connectors include the first connector 111 attached to the first flexible printed wiring board (the first relay portion of the first FPC unit 101) and the second connector 112 attached to the second flexible printed wiring board (the second relay portion of the second FPC unit 102), and the first connector 111 and the second connector 112 are electrically connected.

As illustrated in FIGS. 11 and 12, the movable first connector 111 attached to the relay portion of the first FPC unit 101 and the movable second connector 112 attached to the relay portion of the second FPC unit 102 are electrically connected. A first relay connector 113 is attached to the relay portion of the second FPC unit 102.

A relay board 121 which seals the magnetic disk 21 and the like in the housing 10 and a printed circuit board 131 which controls constituent members of the HDD are provided in the housing 10. A second relay connector 122 and a third relay connector 123 are attached to the relay board 121. The second relay connector 122 and the third relay connector 123 are provided so as to face each other via the relay board 121. A fourth relay connector 132 is attached to the printed circuit board 131.

The first relay connector 113 attached to the relay portion of the second FPC unit 102 and the second relay connector 122 attached to the relay board 121 are inserted into an insertion hole 11C formed in the base 11 and are electrically connected. Furthermore, the third relay connector 123 attached to the relay board 121 and the fourth relay connector 132 attached to the printed circuit board 131 are electrically connected.

The disk device of the second embodiment, which is configured as described above includes the movable connector (the first connector 111 and the second connector 112) which electrically connects the relay portion of the first FPC unit 101 and the relay portion of the second FPC unit 102. Therefore, it is possible to improve the rigidity of the connecting portion between the relay portion of the first FPC unit 101 and the relay portion of the second FPC unit 102, to which a load is applied according to the operations of the first and second actuator assemblies 32M and 32N which rotate independently. In particular, when the first and second actuator assemblies 32M, 32N rotate in different directions, it is possible to improve the rigidity of the connection portion between the relay portion of the first FPC unit 101 and the relay portion of the second FPC unit 102, to which a relatively large load is applied.

From the above, it is possible to obtain the disk device capable of improving the rigidity of the connection portion between the relay portion of the first FPC unit 101 and the relay portion of the second FPC unit 102.

(Modification of Second Embodiment)

Figure 13:
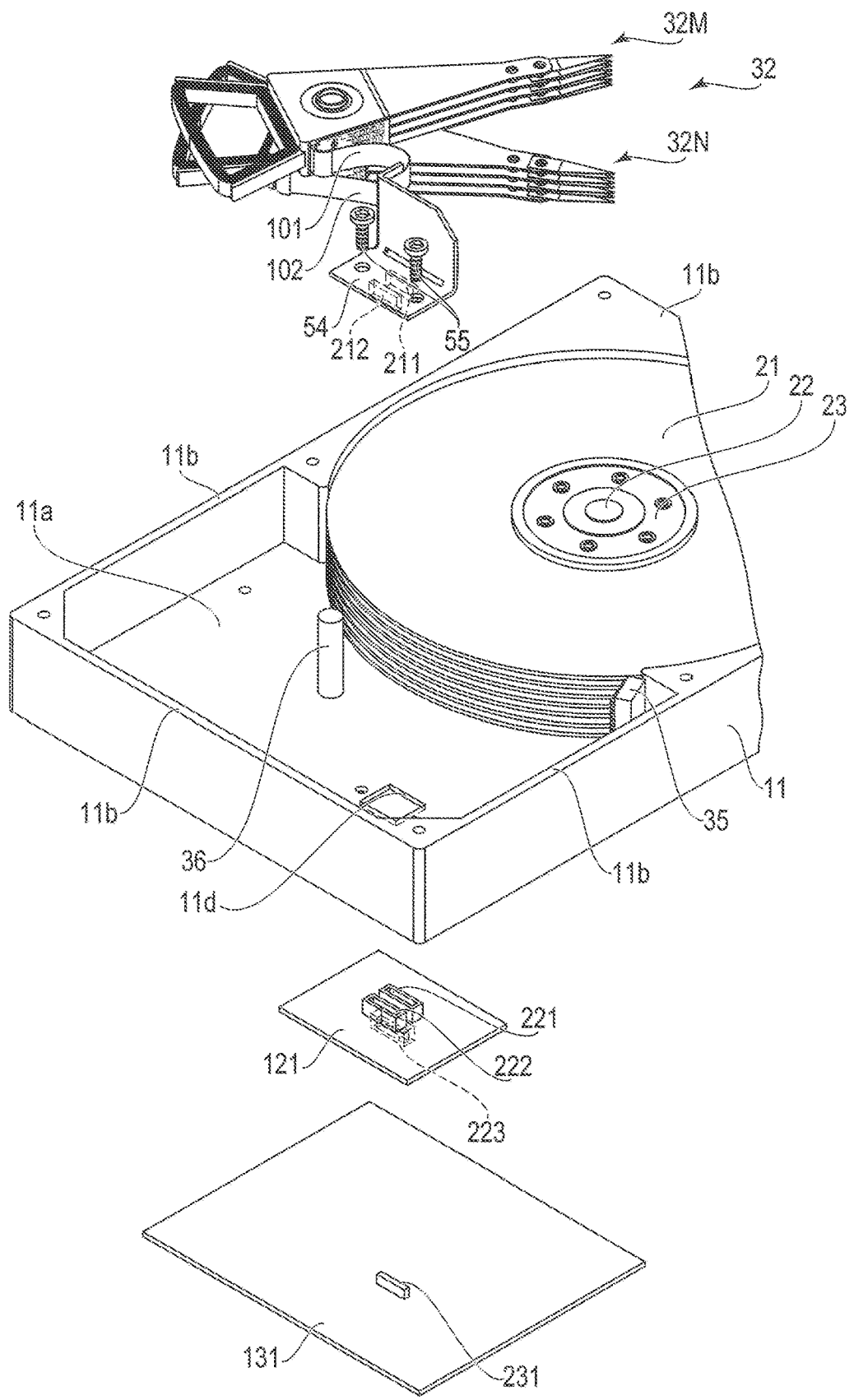
FIG. 13 is an exploded perspective view of a hard disk drive (HDD) including a disk device according to a modification of the second embodiment.
Figure 14:
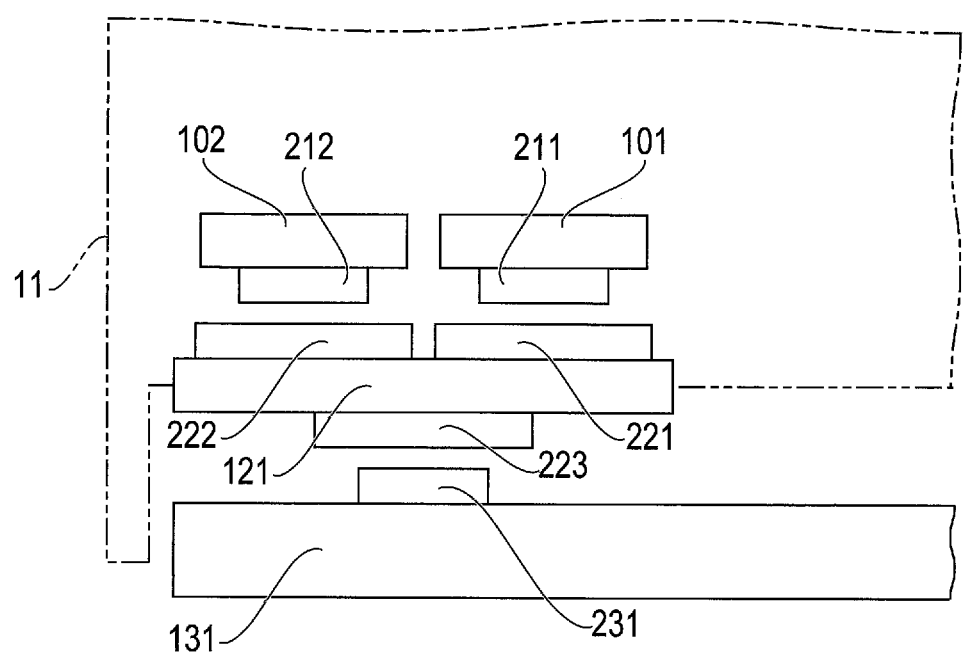
FIG. 14 is a schematic view illustrating a connection between an FPC unit and a control board of FIG. 13.

FIG. 13 is an exploded perspective view of a hard disk drive (HDD) including a disk device according to a modification of the second embodiment. FIG. 14 is a schematic view illustrating a connection between an FPC unit and a control board of FIG. 13.

The disk device according to the modification of the second embodiment includes the following configuration.

The disk device includes a recording medium (magnetic disk 21), a first actuator assembly 32M, a second actuator assembly 32N, a first flexible printed wiring board (a relay portion of a first FPC unit 101), a second flexible printed wiring board (a relay portion of a second FPC unit 102), a board (printed circuit board 131), a relay board 121, a first connector unit (a first relay connector 211 and a third relay connector 221), a second connector unit (a second relay connector 212 and a fourth relay connector 222), a third connector unit (a fifth relay connector 223 and a sixth relay connector 231).

The recording medium (magnetic disk 21) has a plurality of disk shapes and is rotatably provided. The first actuator assembly 32M is supported by the support shaft 36. The second actuator assembly 32N is supported by a support shaft 36 and spaced apart from the first actuator assembly 32M. The first flexible printed wiring board (the relay portion of the first FPC unit 101) is attached to the first actuator assembly 32M. The second flexible printed wiring board (the relay portion of the second FPC unit 102) is attached to the second actuator assembly 32N. The board (printed circuit board 131) controls at least the first actuator assembly 32M and the second actuator assembly 32N. The relay board 121 relays the first actuator assembly 32M and the second actuator assembly 32N, and the board (printed circuit board 131).

The first connector unit (the first relay connector 211 and the third relay connector 221) is movable and electrically connects the first flexible printed wiring board (the relay portion of the first FPC unit 101) and the relay board 121. The second connector unit (the second relay connector 212 and the fourth relay connector 222) is movable and electrically connects the second flexible printed wiring board (the relay portion of the second FPC unit 102) and the relay board 121. The third connector unit (the fifth relay connector 223 and the sixth relay connector 231) is movable and electrically connects the relay board 121 and the board (printed circuit board 131).

As illustrated in FIGS. 13 and 14, the movable first relay connector 211 is attached to the relay portion of the first FPC unit 101. The movable second relay connector 212 is attached to the relay portion of the second FPC unit 102.

The relay board 121 which seals the magnetic disk 21 and the like in the housing 10 and the printed circuit board 131 which controls constituent members of the HDD are provided in the housing 10. The movable third relay connector 221, the movable fourth relay connector 222, and the movable fifth relay connector 223 are attached to the relay board 121. The third relay connector 221 and the fourth relay connector 222, and the fifth relay connector 223 are provided to face each other via the relay board 121. The movable sixth relay connector 231 is attached to the printed circuit board 131.

The first relay connector 211 attached to the relay portion of the first FPC unit 101 and the third relay connector 221 attached to the relay board 121 are inserted into an insertion hole 11d formed in the base 11 and are electrically connected. The second relay connector 212 attached to the relay portion of the second FPC unit 102 and the fourth relay connector 222 attached to the relay board 121 are inserted into the insertion hole 11d formed in the base 11 and are electrically connected. Furthermore, the fifth relay connector 223 attached to the relay board 121 and the sixth relay connector 231 attached to the printed circuit board 131 are electrically connected.

The disk device of the modification of the second embodiment, which is configured as described above, includes the movable first connector unit (the first relay connector 211 and the third relay connector 221), the movable second connector unit (the second relay connector 212 and the fourth relay connector 222), and the movable third connector unit (the fifth relay connector 223 and the sixth relay connector 231). Therefore, it is possible to improve the rigidity of the connection portion between the relay portion of the first FPC unit 101 and the relay board 121 and the connection portion between the relay portion of the second FPC unit 102 and the relay board 121, to which a load is applied according to the operations of the first and second actuator assemblies 32M and 32N. In addition, without depending on the mounting accuracy of the relay board 121 and the printed circuit board 131 with respect to the base 11, the relay portion of the first FPC unit 101 and the relay portion of the second FPC unit 102 can be connected to the relay board 121, and the relay board 121 can be connected to the printed circuit board 131.

In particular, in order to make the relay board 121 function as a sealing gasket in the housing 10, it is preferable to use the movable relay connector which absorbs relative misalignment bonding the relay portion of the first FPC unit 101, the relay portion of the second FPC unit 102, and the printed circuit board 131.

The present invention is not limited to the above embodiments or modifications as they are, and the constituent components can be modified and embodied at the implementation stage without departing from the scope of the invention. In addition, various inventions can be formed by appropriate combinations of a plurality of constituent components disclosed in the above embodiments. For example, some constituent components may be deleted from all the components shown in the embodiments. Furthermore, constituent components in different embodiments may be combined as appropriate.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A disk device comprising:
    a plurality of disk-shaped recording media;
    a first actuator assembly supported by a support shaft;
    a second actuator assembly supported by the support shaft and spaced from the first actuator assembly;
    a flexible printed wiring board comprising a base portion, a first plate extending from the base portion and connected to the first actuator assembly, and a second plate extending from the base portion and connected to the second actuator assembly;
    a support plate fixed to the base portion of the flexible printed wiring board;
    a metal layer provided in the base portion; and
    a screw which fastens the metal layer and the base portion to the support plate,
    wherein the first plate is located in a first height, and the second plate is located in a second height higher than the first height, and the metal layer is located in a third height between the first height and the second height.

2. The disk device according to claim 1, wherein the metal layer is provided in an intermediate region between the first plate and the second plate in the base portion.

3. The disk device according to claim 1, wherein the metal layer comprises a first metal layer provided in the base portion on a side of the first plate, a second metal layer provided in the base portion on a side of the second plate, and which further comprises a first fixing screw which fastens the first metal layer and the base portion to the support member, and a second fixing screw which fastens the second metal layer and the base portion to the support member.

4. The disk device according to claim 3, wherein the base portion comprises a curved portion formed between the first metal layer and the second metal layer and curved in a direction away from the support member.

5. The disk device according to claim 1, wherein the metal layer is provided in the base portion across an edge portion of the support member.

6. The disk device according to claim 1, wherein the flexible printed wiring board comprises a ground pad, and the metal layer is integrally formed with the ground pad.

7. A disk device comprising:

a plurality of disk-shaped recording media;

a first actuator assembly supported by a support shaft;

a second actuator assembly supported by the support shaft and spaced from the first actuator assembly;

a flexible printed wiring board comprising a base portion, a first relay portion extending from the base portion and connected to the first actuator assembly, a second relay portion extending from the base portion and connected to the second actuator assembly, and a ground pad in the base portion;

a support member fixed to the base portion of the flexible printed wiring board; and a reinforcing member provided in the base portion in the vicinity of the first relay portion and the second relay portion and integrally formed with the ground pad.

8. The disk device according to claim 7, wherein the reinforcing member comprises a pair of first metal layers provided in the base portion on a side of the first plate and the second plate, and a pair of second metal layers provided in the base portion on a side of the first plate and the second plate, and the first metal layers and the second metal layers are overlapped in a thickness direction of the base portion.

9. A disk device comprising:

a plurality of disk-shaped recording media;

a first actuator assembly supported by a support shaft;

a second actuator assembly supported by the support shaft and spaced from the first actuator assembly;

a flexible printed wiring board comprising a base portion, a first relay portion extending from the base portion and connected to the first actuator assembly, and a second relay portion extending from the base portion and connected to the second actuator assembly;

a support member fixed to the base portion of the flexible printed wiring board;

a reinforcing member comprising a first metal layer provided in the base portion on a side of the first relay portion, and a second metal layer provided in the base portion on a side of the second relay portion;

a first fixing screw which fastens the first metal layer and the base portion to the support member; and a second fixing screw which fastens the second metal layer and the base portion to the support member.

* * * * *